US011227553B2

(12) United States Patent
Ueno

(10) Patent No.: US 11,227,553 B2
(45) Date of Patent: Jan. 18, 2022

(54) DISPLAY DEVICE

(71) Applicant: SHARP KABUSHIKI KAISHA, Sakai (JP)

(72) Inventor: Tetsuya Ueno, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/043,655

(22) PCT Filed: Apr. 10, 2018

(86) PCT No.: PCT/JP2018/015137
§ 371 (c)(1),
(2) Date: Sep. 30, 2020

(87) PCT Pub. No.: WO2019/198163
PCT Pub. Date: Oct. 17, 2019

(65) Prior Publication Data
US 2021/0020112 A1  Jan. 21, 2021

(51) Int. Cl.
G09G 3/30 (2006.01)
G09G 3/3266 (2016.01)
G09G 3/3275 (2016.01)
H01L 27/32 (2006.01)

(52) U.S. Cl.
CPC ......... *G09G 3/3266* (2013.01); *G09G 3/3275* (2013.01); *H01L 27/3258* (2013.01)

(58) Field of Classification Search
CPC ............... G02F 1/1345; G02F 1/13456; G02F 2201/56; G09G 2300/0426; G09G 2310/0218; G09G 2310/0278; G09G 2310/0281; G09G 2310/0291; G09G 2320/0233; G09G 2380/16; G09G 3/20; G09G 3/3648; G09G 3/3666; G09G 3/3677

See application file for complete search history.

(56) References Cited

U.S. PATENT DOCUMENTS

2004/0263670 A1\* 12/2004 Yamasaki ......... H01L 27/14623
348/340
2009/0051636 A1\* 2/2009 Natori .................. G09G 3/3648
345/87
2016/0019856 A1  1/2016 Tanaka et al.
2017/0162637 A1  6/2017 Choi et al.
2020/0135813 A1\* 4/2020 Lee .......................... G06F 3/044

FOREIGN PATENT DOCUMENTS

CN 107039493 A 8/2017
JP 2005-010407 A 1/2005
WO 2014/142183 A1 9/2014

\* cited by examiner

Primary Examiner — Insa Sadio
(74) Attorney, Agent, or Firm — ScienBiziP, P.C.

(57) ABSTRACT

A first region and a second region do not include sub-pixel circuits. The second region is surrounded by a display area. The first region is surrounded by the second region. When viewed orthogonally to the display area, a plurality of signal lines are provided across the second region. The signal lines include at least either two or more of scanning signal lines, or two or more of data signal lines. The signal lines across the second region run out of an edge of the first region.

16 Claims, 10 Drawing Sheets

DISPLAY DEVICE

TECHNICAL FIELD

The disclosure relates to a display device.

BACKGROUND ART

Patent Document 1 discloses a display panel whose display area includes an aperture.

CITATION LIST

Patent Literature

[Patent Document 1] Japanese Unexamined Patent Application Publication No. 2005-010407 (Published on Jan. 13, 2005)

SUMMARY

Technical Problem

The above known technique has to address a problem of a broken signal line caused by the aperture.

Solution to Problem

A display device according to an aspect of the disclosure includes: a display area including: a plurality of scanning signal lines; a plurality of data signal lines intersecting with the scanning signal lines; and a plurality of sub-pixel circuits each disposed on a corresponding one of a plurality of intersections of the scanning signal lines and the data signal lines, each of the sub-pixel circuits including: a control circuit including a transistor; a reflective electrode; a light-emitting element; and a transparent electrode, a first region and a second region being provided not to include the sub-pixel circuits, the first region being surrounded by the second region, and the second region being surrounded by the display area, when viewed orthogonally to the display area, a plurality of signal lines being provided across the second region, the signal lines including at least either two or more of the scanning signal lines, or two or more of the data signal lines, and the signal lines across the second region running out of an edge of the first region.

Advantageous Effects of Disclosure

An aspect of the disclosure makes it possible to form a first region transparent to light, without breaking a plurality of wires running through a display area.

DESCRIPTION OF EMBODIMENTS

In the description below, the term "same layer" means that constituent features are formed in the same process (in the same film deposition process). The term "lower layer (or layer below)" means that a constituent feature is formed in a previous process before a comparative layer is formed. The term "upper layer (or layer above)" means that a constituent feature is formed in a successive process after a comparative layer is formed.

Figure 1:
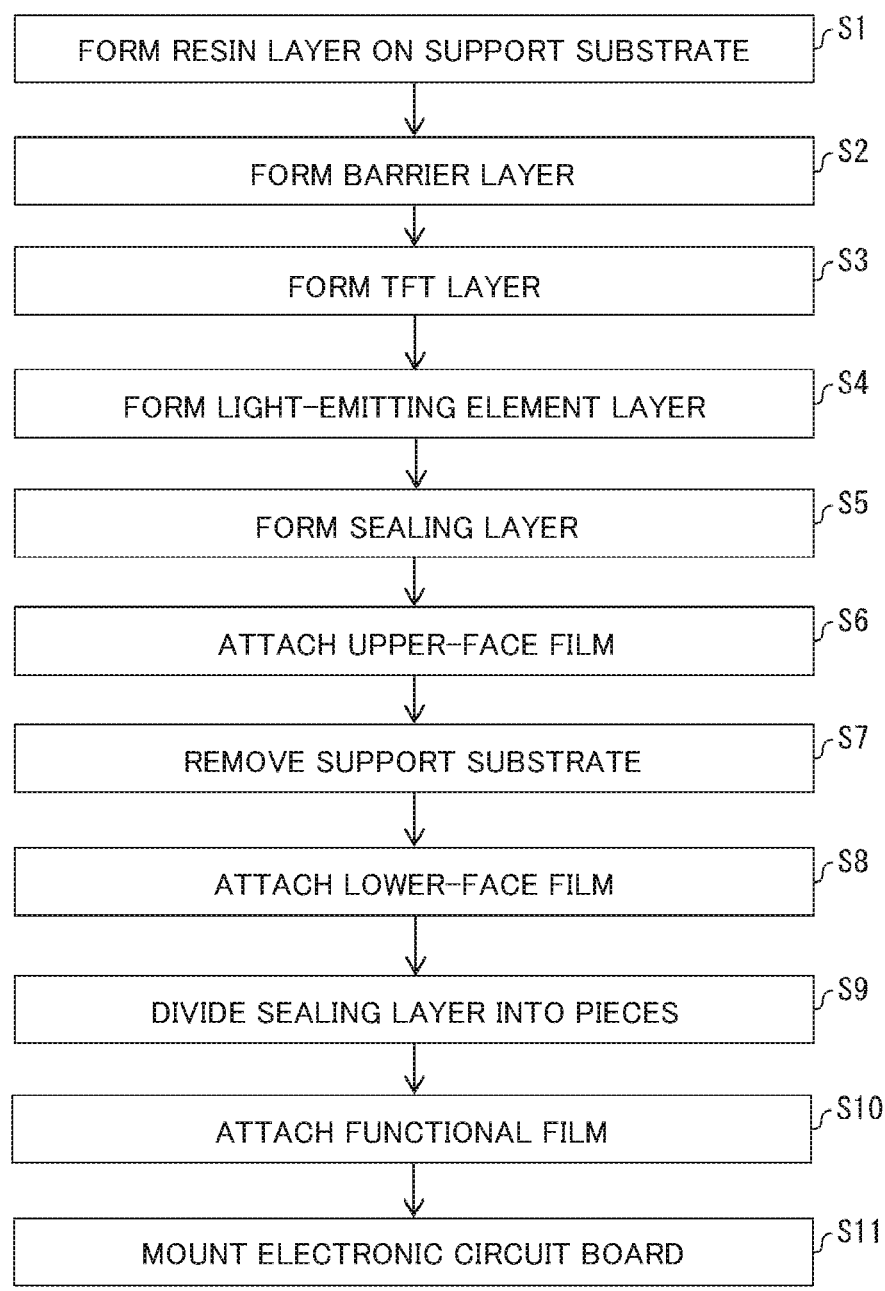
FIG. 1 is a flowchart illustrating an example of a method for producing a display device.
Figure 2:
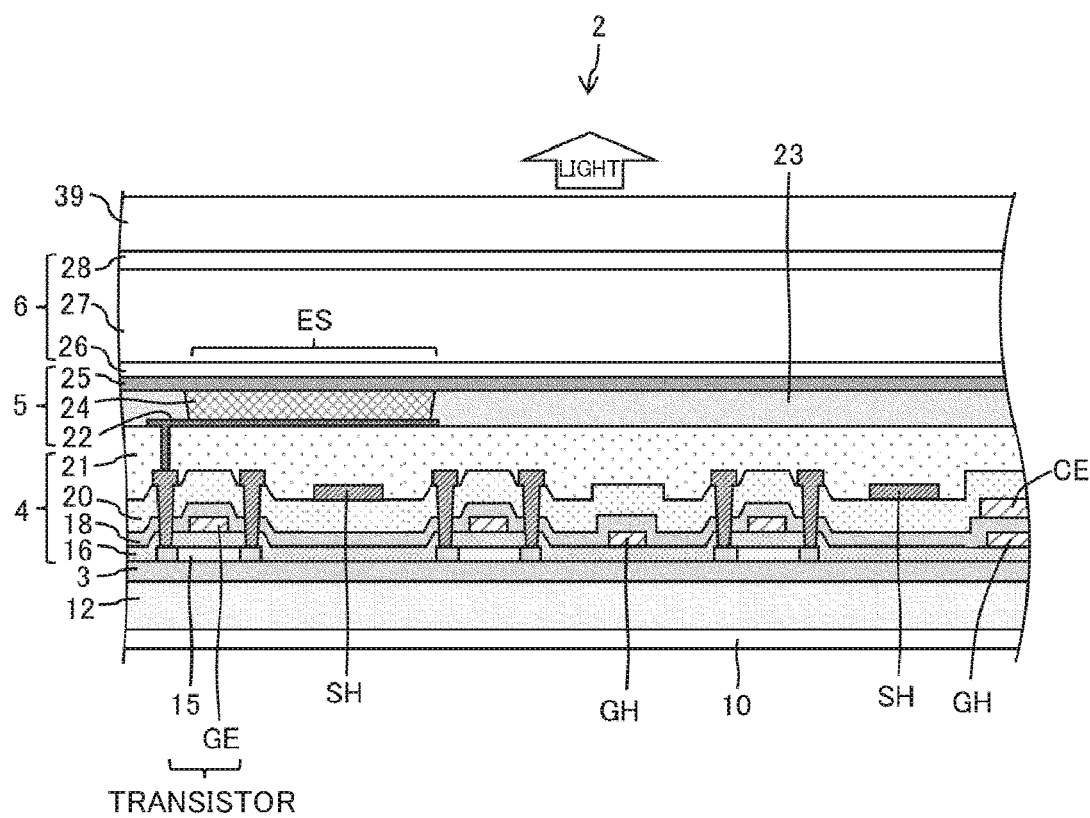
FIG. 2 is a cross-sectional view illustrating a configuration example of a display area of the display device.

FIG. 1 is a flowchart illustrating an example of a method for producing a display device. FIG. 2 is a cross-sectional view illustrating a configuration example of a display unit of the display device.

In producing a flexible display device, first, as illustrated in FIGS. 1, and 2, a resin layer 12 is formed on a support substrate (e.g., a mother glass) transparent to light (Step S1). Next, a barrier layer 3 is formed (Step S2). Next, a thin-film transistor (TFT) layer 4 is formed (Step S3). Next, a light-emitting element layer 5 of a top emission type is formed (Step S4). Next, a sealing layer 6 is formed (Step S5). Next, on the sealing layer 6, an upper-face film is attached (Step S6).

Then, the support substrate is removed from the resin layer 12 with, for example, a laser beam emitted on the support substrate (Step S7). Next, to the lower face of the resin layer 12, a lower-face film 10 is attached (Step S8). Next, a stack including the lower-face film 10, the resin layer 12, the barrier layer 3, the TFT layer 4, the light-emitting element layer 5, and the sealing layer 6 is divided into a plurality of pieces (Step S9). Next, to each of the obtained pieces, a functional film 39 is attached (Step S10). Next, an electronic circuit board (e.g., an IC chip and a flexible printed circuit, or FPC) is partially mounted on the outside (a non-display area NA, or a frame) of a display area in which a plurality of sub-pixels are formed (Step S11). Note that Steps S1 to S11 are executed by a display device production apparatus (including a deposition apparatus executing each of Steps S1 to S5).

The resin layer 12 is made of, for example, polyimide. As illustrated in FIG. 2, the resin layer 12 may be replaced with a double-layer resin film (e.g., a polyimide film), and with an inorganic insulating film sandwiched between the layers of the resin film.

The barrier layer 3 prevents such foreign objects as water and oxygen from reaching the TFT layer 4 and the light-emitting element layer 5. An example of the barrier layer 3 includes a silicon oxide film, a silicon nitride film, or a silicon oxide nitride film formed by the chemical-vapor deposition (CVD), or a multilayer film including those films.

The TFT layer 4 includes: a semiconductor film 15; an inorganic insulating film 16 (a gate insulating film) 16 above the semiconductor film 15; a gate electrode GE and a gate wire GH above the inorganic insulating film 16; an inorganic insulating film 18 above the gate electrode GE and the gate wire GH; a capacitance electrode CE above the inorganic insulating film 18; an inorganic insulating film 20 above the capacitance electrode CE; a source wire SH above the inorganic insulating film 20; and a planarization film 21 above the source wire SH.

The semiconductor film 15 is formed of, for example, low-temperature polysilicon (LTPS) or an oxide semiconductor (e.g., an In—Ga—Zn—O—based semiconductor). A thin-film transistor (TFT) is formed to contain the semiconductor film 15, and the gate electrode GE. In FIG. 2, the TFT is illustrated as a top-gate TFT. Alternatively, the TFT may be a bottom-gate TFT.

The gate electrode GE, the gate wire GH, the capacitance electrode CE, and the source wire SH are each formed of a metal monolayer film or a metal multilayer film including at least one of aluminum, tungsten, molybdenum, tantalum, chromium, titanium, or copper. The TFT layer 4 in FIG. 2 includes a monolayer semiconductor layer and a three-layer metal layer (a first metal layer, a second metal layer, and a third metal layer).

The inorganic insulating films 16, 18, and 20 can be, for example, a silicon oxide (SiOx) film, or a silicon nitride (SiNx) film formed by the CVD, or a multilayer film including these films. The planarization film 21 may be made of an applicable organic material such as polyimide and acrylic.

The light-emitting element layer 5 includes: an anode 22 above the planarization film 21; an edge cover 23 having insulation and covering an edge of the anode 22; an electro luminescence (EL) layer 24 above the edge cover 23; and a cathode 25 above the EL layer 24. The edge cover 23 is formed of, for example, an organic material such as polyimide and acrylic. The organic material is applied, and then patterned by photolithography to form the edge cover 23.

For each of the sub-pixels, the light-emitting element layer 5 includes a light-emitting element ES (e.g., an organic light-emitting diode (OLED) and a quantum dot light-emitting-diode (QLED)) including: the anode 22 and the EL layer 24 each shaped into an island; and the cathode 25. The TFT layer 4 includes a circuit controlling the light-emitting element ES. The light-emitting element ES and the circuit controlling the light-emitting element ES constitute a sub-pixel circuit.

The EL layer 24 includes a hole-injection layer, a hole-transport layer, a light-emitting layer, an electron-transport layer, and an electron-injection layer stacked on top of another in the stated order from below. The light-emitting layer is shaped into an island formed in an opening of the edge cover 23 (for each sub pixel) by vapor deposition or an ink jet method. The other layers are shaped into islands or a monolithic form. Moreover, the EL layer 24 may omit one or more of the hole-injection layer, the hole-transport layer, the electron-transport layer, and the electron-injection layer.

In vapor-depositing to form a light-emitting layer of the OLED, a fine metal mask (FMM) is used. The FMM is a sheet (e.g., invar) including many openings. Organic material passing through one opening forms a light-emitting layer (corresponding to one sub-pixel) shaped into an island.

A light-emitting layer of the QLED is formed of, for example, a solvent in which quantum dots are dispersed. The solvent is applied by an ink-jet method to form the light-emitting layer (corresponding to one sub-pixel) shaped into an island.

The anode (a positive electrode) 22 is formed of, for example, indium tin oxide (ITO), and silver (Ag) or an alloy including Ag stacked on top of each other. The anode 22 reflects light (a reflective electrode). The cathode (a negative electrode) 25 can be formed of a conductive material, which is transparent to light, such as an MgAg alloy (an ultra-thin film), ITO, and indium zinc oxide (IZO) (a transparent electrode).

If the light-emitting element ES is the OLED, holes and electrons recombine together in the light-emitting layer by a drive current between the anode 22 and the cathode 25, which forms an exciton. While the exciton transforms to the ground state, light is emitted. Since the cathode 25 is transparent to light and the anode 22 is light-reflective, the light emitted from the EL layer 24 travels upward. This is how the light-emitting element layer 5 is of a top emission type.

If the light-emitting element ES is the QLED, holes and electrons recombine together in the light-emitting layer by a drive current between the anode 22 and the cathode 25, which forms an exciton. While the exciton transforms from the conduction band level to the valence band level, light (fluorescence) is emitted.

The light-emitting element layer 5 may include a light-emitting element (e.g., an inorganic light-emitting diode) other than the OLED and the QLED.

The sealing layer 6 is transparent to light, and includes: an inorganic sealing film 26 covering the cathode 25; an organic buffer film 27 above the inorganic sealing film 26; and an inorganic sealing film 28 above the organic buffer film 27. The sealing layer 6 covering the light-emitting element layer 5 prevents such foreign objects as water and oxygen from penetrating into the light-emitting element layer 5.

The inorganic sealing films 26 and 28 are both inorganic insulating films. An example of the inorganic sealing films 26 and 28 includes a silicon oxide film, a silicon nitride film, or a silicon oxide nitride film formed by the CVD, or a multilayer film including those films. The organic buffer film 27 is an organic film transparent to light and providing a planarized face. The organic buffer film 27 may be made of an applicable organic material such as acrylic. The organic buffer film 27 can be formed by, for example, an inkjet method. The non-display area may be provided with a bank to block droplets.

The lower-face film 10 is attached to the lower face of the resin layer 12 after the support substrate is removed, so that the display device excels in flexibility. The lower-face film 10 is made of, for example, polyethylene terephthalate (PET). The functional film 39 has at least one of such functions as optical compensation, touch sensing, and protection.

Described above is a flexible display device. In the case where an inflexible display device is produced, steps such as forming a resin layer and replacing a base material are usually unnecessary. Hence, for example, the glass substrate undergoes stacking steps such as Steps S2 to S5, and then proceeds to Step S9.

First Embodiment

Figure 3:
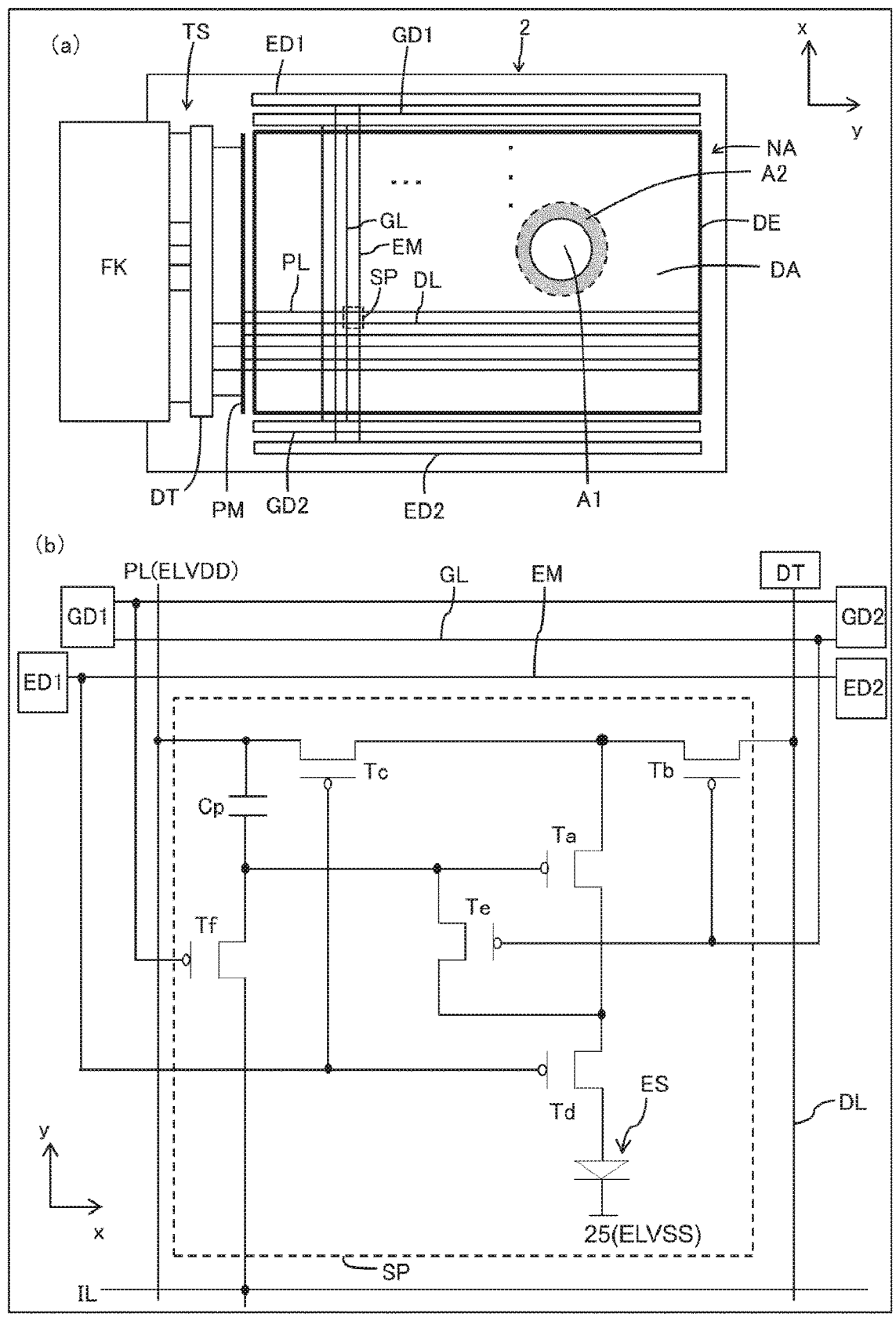
FIG. 3(a) is a plan view illustrating a configuration of the display device, and FIG. 3 (b) is a circuit diagram illustrating a configuration of a circuit of a sub-pixel included in the display area.

FIG. 3(a) is a plan view illustrating a configuration of the display device, and FIG. 3(b) is a circuit diagram illustrating a configuration of a circuit of a sub-pixel included in the display area. As illustrated in FIG. 3, a display device 2 includes: a display area DA including a plurality of sub-pixels SP; and a frame area (a non-display area) NA surrounding the display area DA. The display area DA includes: a plurality of scanning signal lines GL extending in an x-direction; a plurality of data signal lines DL extending in a y-direction orthogonal to the x-direction; a plurality of light-emission control lines EM extending in the x-direction; and a plurality of high-voltage power supply lines PL extending in the y-direction. The high-voltage power supply lines PL are supplied with ELVDD through a trunk wire PM.

Each of the sub-pixel circuits SP including a light-emitting element ES is connected to a data signal line DL, a scanning signal line GL, a light-emission control line EM, a high-voltage power supply line PL, and an initialization power supply line IL. Note that a capacitance Cp has an electrode connected to the high-voltage power supply line PL, and another electrode connected to a gate terminal of a drive transistor Ta. The drive transistor Ta has the gate terminal connected to the scanning signal line GL, a source terminal connected to the data signal line DL through a write transistor Tb, and a drain terminal connected to the light-emitting element ES through a transistor Td. The data signal line DL is connected to a driver chip DT. The scanning signal line GL is connected to gate drivers GD1 and GD2. The light-emission control line EM is connected to emission drivers ED1 and ED2. The gate drivers GD1 and GD2, and the emission drivers ED1 and ED2 are formed monolithically in the TFT layer 4 included in the frame area NA.

The gate drivers GD1 and GD2 are each disposed at one of opposing ends of a short side of the display area DA to sandwich the display area DA. The emission drivers ED1 and ED2 are also each arranged at one of the opposing ends of the short side of the display area DA to sandwich the display area DA. Note that the emission drivers ED1 and ED2 are positioned outside (closer to an edge of the display device) the gate drivers GD1 and GD2.

The frame area NA has a terminal TS on which the driver chip DT (a source driver) is mounted. Connected to the driver chip DT are the data signal lines DL and the trunk wire PM. The data signal lines DL may be connected to the driver chip DT through an SSD circuit (a switching circuit monolithically formed in the TFT layer 4 for time division driving). Connected to the terminal TS is a flexible circuit substrate FK (a substrate on which such components as a processor and a power source circuit are mounted).

In the first embodiment, included behind an edge (an outer edge) DE of the display area DA are: a region A1 (a first region) that is transparent to light and not including the sub-pixel circuits SP; and a region A2 surrounding the region A1 and not including the sub-pixel circuits SP. The region A2, which is surrounded by the display area DA, is a region in which signal lines are routed. The region A1 and the region A2 are non-display areas provided behind the edge DE of the display area DA. The display area DA is an area behind the edge DE other than the regions A1 and A2.

The region A1 is, for example, a light-transparent region for imaging, and a plurality of data signal lines and a plurality of scanning signal lines run across the region A2 acting as a region for routing.

Figure 4:
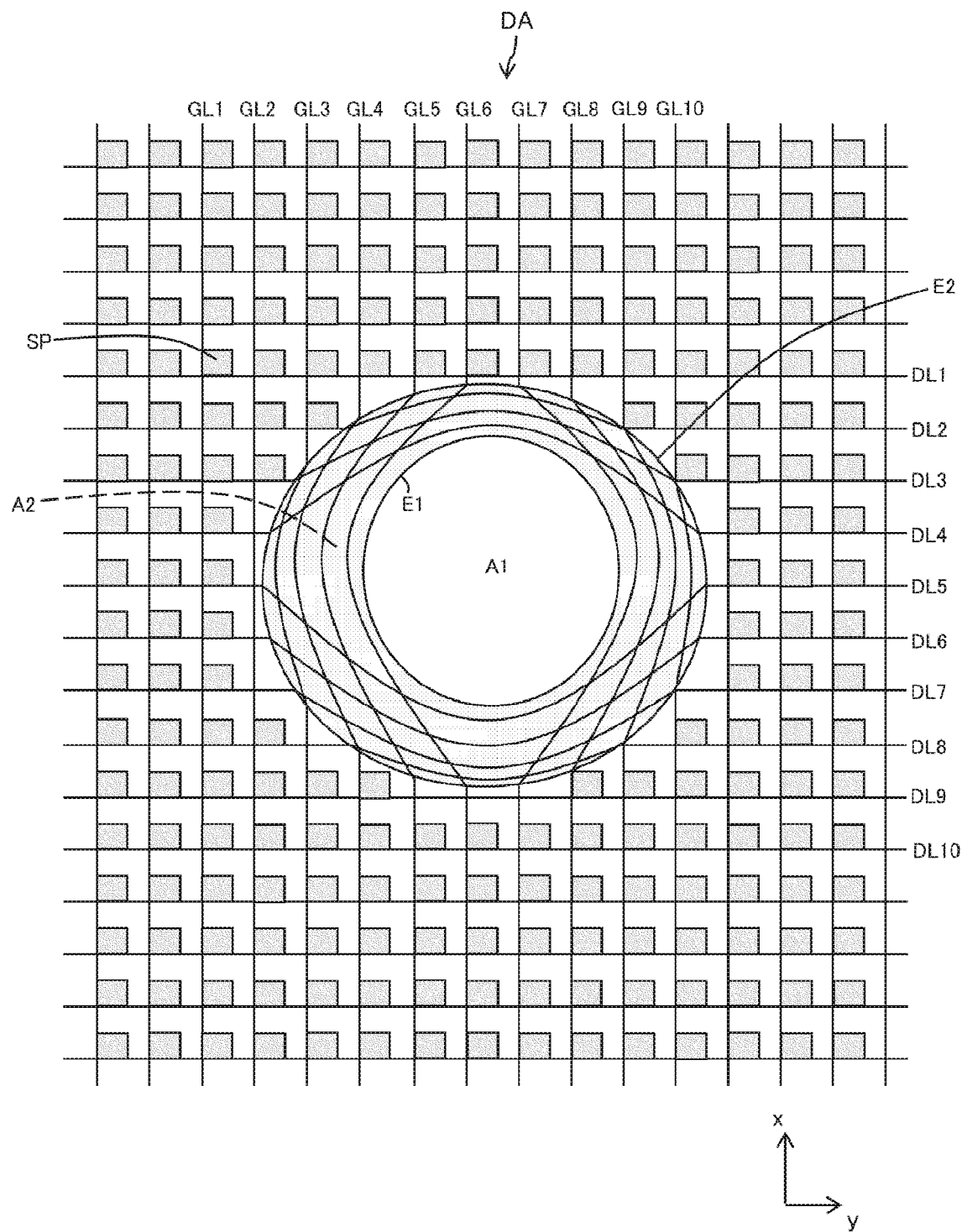
FIG. 4 is a plan view illustrating a configuration around an aperture in a first embodiment.

FIG. 4 is a plan view illustrating a configuration around the first region in the first embodiment. As illustrated in FIG. 4, the display area DA includes: data signal lines DL1 to DL10; and scanning signal lines GL1 to GL10. When viewed orthogonally to the display area DA, the data signal lines DL2 to DL8 and the scanning signal lines GL3 to GL10 are formed across the region A2.

For example, a sub-pixel circuit SP is formed near the intersection of the scanning signal line GL1 and the data signal line DL1; whereas, no sub-pixel circuit SP is formed in the region A1 or in the region A2. A sub-pixel circuit SP includes a light-emitting element and a circuit controlling the light-emitting element (see FIG. 3). In planar view, the region A1 is larger than at least an area that the sub-pixel circuit SP occupies.

In FIG. 4, the scanning signal lines GL3 to GL10 across the region A2 run out of the edge E1 of the region A1, and the data signal lines DL2 to DL8 across the region A2 run out of the edge E1 of the region A1. That is, the data signal lines DL2 to DL8 and the scanning signal lines GL3 to GL10 running across the region A2 are routed to avoid (to detour) the region A1, so neither the data signal lines nor the scanning signal lines are arranged in the region A1.

Figure 5:
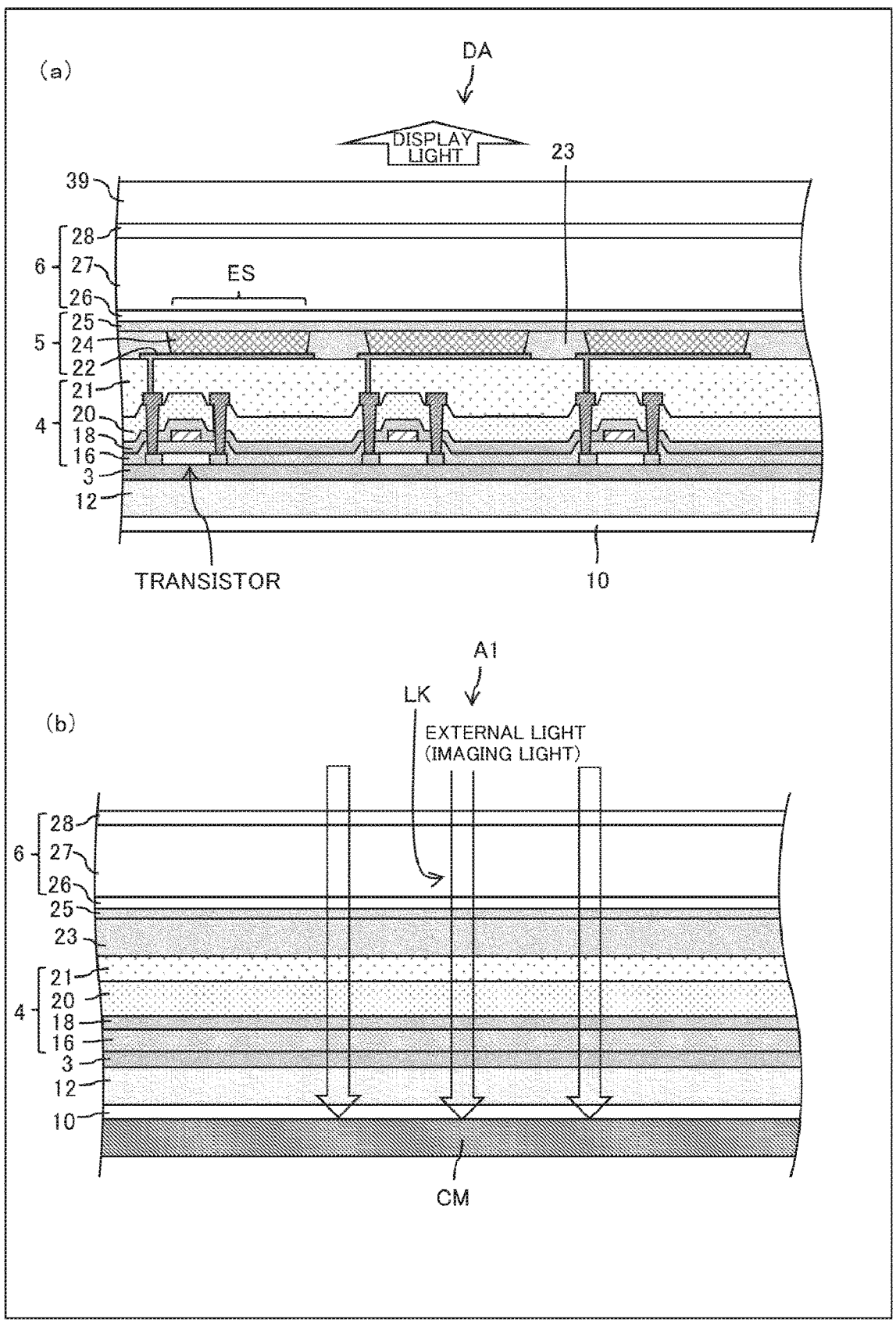
FIG. 5(a) is a cross-sectional view illustrating a configuration of the display area in the first embodiment.
FIG. 5(b) is a cross-sectional view illustrating a configuration of a first region in the first embodiment.

FIG. 5(a) is a cross-sectional view illustrating a configuration of the display area DA in the first embodiment, and FIG. 5(b) is a cross-sectional view illustrating a configuration of the first region in the first embodiment. As illustrated in FIG. 5, the region A1 does not include: a transistor in the same layer in which a layer of a transistor in the display area DA is formed; a reflective electrode in the same layer in which the anode 22 in the display area DA is formed; or an EL layer in the same layer in which the EL layer 24 in the display area DA is formed. Note that, the region A1 includes: the lower-face film 10; the resin layer 12; the barrier layer 3; the inorganic insulating films 16, 18, 20, and 21 of the TFT layer 4; and the cathode 25 (a light-transparent metal film) and the sealing layer 6 (transparent to light) that are common in the display area DA. Such a feature allows a light transmission path LK for imaging to be formed in the region A1. Note that if no opening is provided to the edge cover 23, the sub-pixel circuit does not function (does not emit light) as it is supposed to. Instead of providing an opening to the edge cover 23, a dummy transistor and a dummy light-emitting layer may be provided.

On the rear of the display surface (a face from which display light exits), an imaging element CM is disposed to coincide with the region A1 (the light transmission path LK). The imaging element CM receives external light passing through the light transmission path LK.

In the first embodiment, the region A1 (the light transmission path LK for imaging) can be formed without breaking the data signal lines and the scanning signal lines in the display area DA.

The region A2, which is for routing wires, is preferably the same in configuration as the region A1 to improve collectivity of the wires and to enhance efficiency in lighting.

Figure 6:
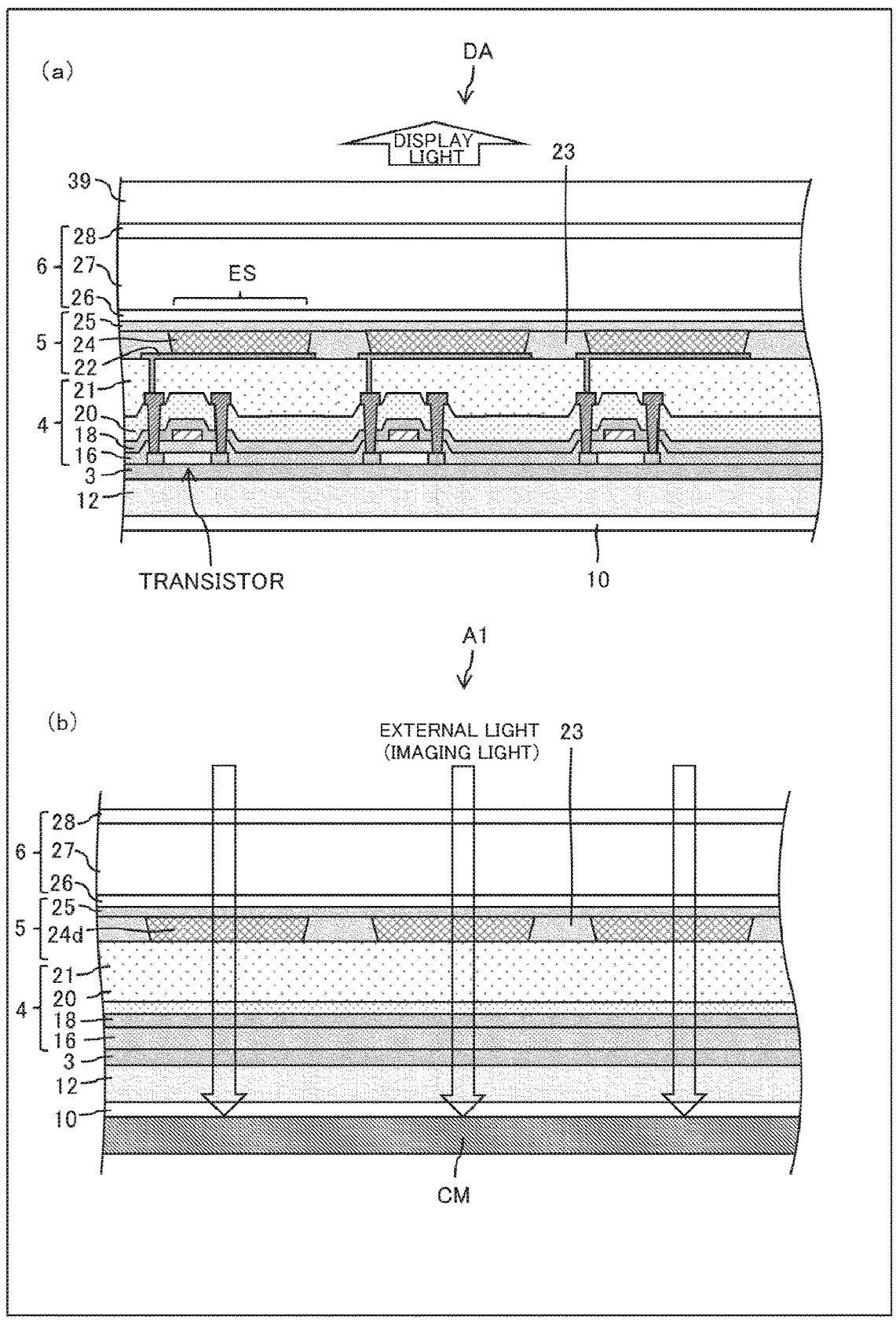
FIG. 6 is a cross-sectional view illustrating another configuration around the aperture.

FIG. 6 is illustrates a modification of the first embodiment. As illustrated in FIG. 6, the region A1 does not include a transistor in the same layer in which the transistor of the display area DA is formed, or a reflective electrode in the same layer in which the anode 22 of the display area DA is formed. The region A1 may, however, include a light-transparent dummy EL layer 24d (including a dummy light-emitting layer) in the same layer in which the EL layer 24 of the display area DA is formed. (Note that the region A2 is the same in configuration as the region A1.) The dummy light-emitting layer is the same in shape and size as a genuine light-emitting layer in the display area DA. Such a feature allows an FMM for use in a deposition step to have the same opening pattern between the region A1 and the display area DA, contributing to making the FMM uniform in rigidity.

If the dummy light-emitting layer is not deposited either on the region A1 or on the region A2, the FMM has different opening patterns between a portion corresponding to the display area DA (with an opening) and a portion corresponding to the regions A1 and A2 (without opening). Hence, the rigidity of the FMM might vary in the portion corresponding to the regions A1 and A2, and the opening pattern of the FMM might be misaligned (due to wrinkles) in the portion corresponding to the display area near the region A2. In order to avoid such a problem, the same opening pattern is adopted between the portion corresponding to the display area DA and the portion corresponding to the regions A1 and A2 (that is, an opening for deposition is also provided to the portion corresponding to the regions A1 and A2), and the dummy light-emitting layer is deposited also on the regions A1 and A2. Note that the statement "the same in shape and size" is recited on the precondition that the regions A1 and A2 are deposited to have the same opening pattern as the display area DA has. Hence, the statement "the same in shape and size" includes slight misalignment such as that in deposition.

Figure 7:
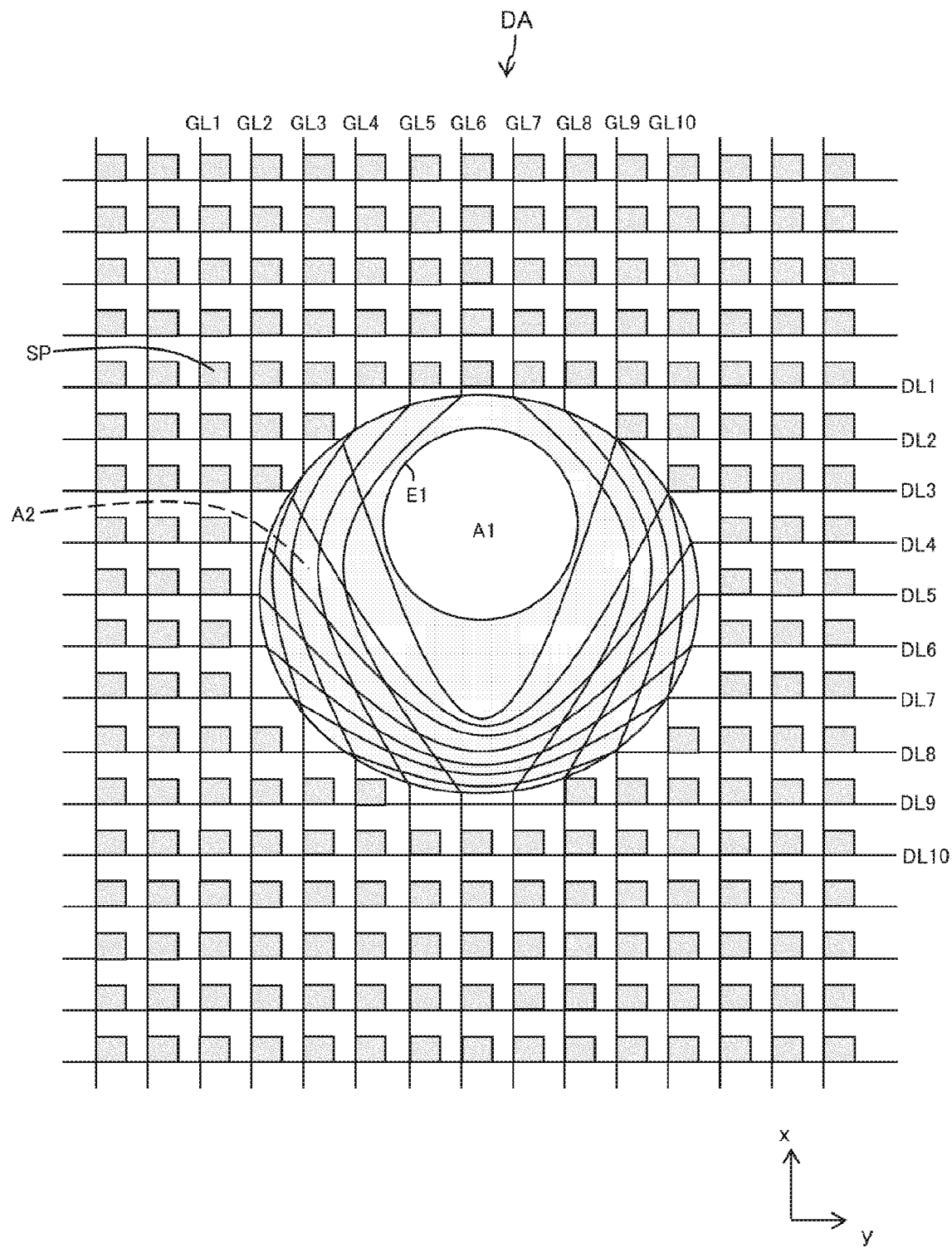
FIG. 7 is a plan view illustrating still another configuration around the aperture.
Figure 8:
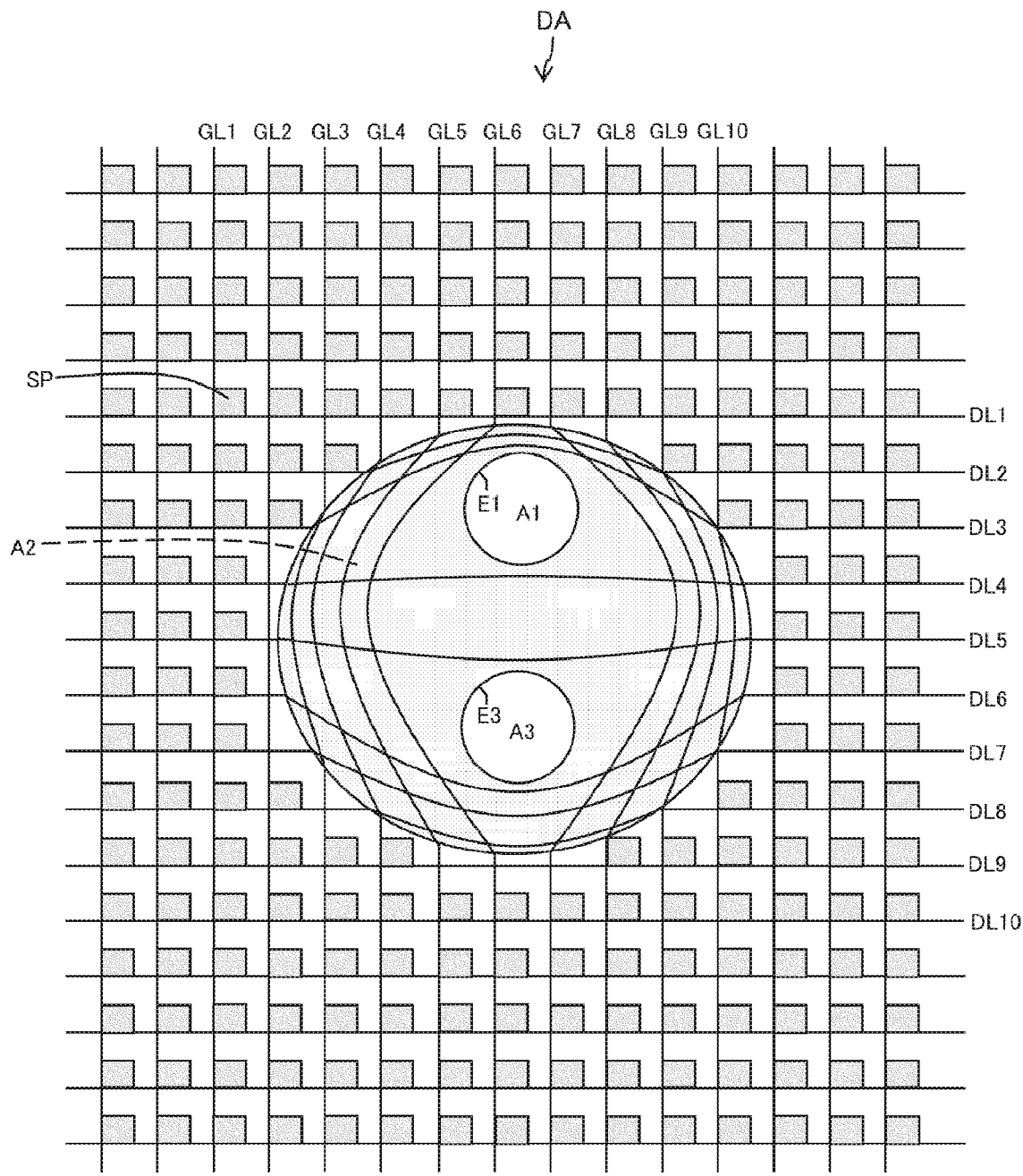
FIG. 8 is a plan view illustrating still another configuration around the aperture.

FIGS. 7 and 8 illustrate modifications of the first embodiment. As illustrated in FIG. 7, the data signal lines DL2 to DL8 across the region A2 may be collected together to one side of the region 2. Moreover, as illustrated in FIG. 8, included behind the edge (the outer edge) DE of the display area DA are: the region A1 (the first region) and a region A3 (a third region) that are transparent to light and not including the sub-pixel circuits SP; and the region A2 surrounding the region A1 and the region A3, and not including the sub-pixel circuits SP. The data signal lines DL4 and DL5 across the region A2 may run out of the edge E1 of the region A1 and an edge E3 of the region A3. In this case, the region A3 is formed in the same configuration as that of the region A1. Such a feature makes it possible to form a light transmission path for imaging in the region A3.

Figure 9:
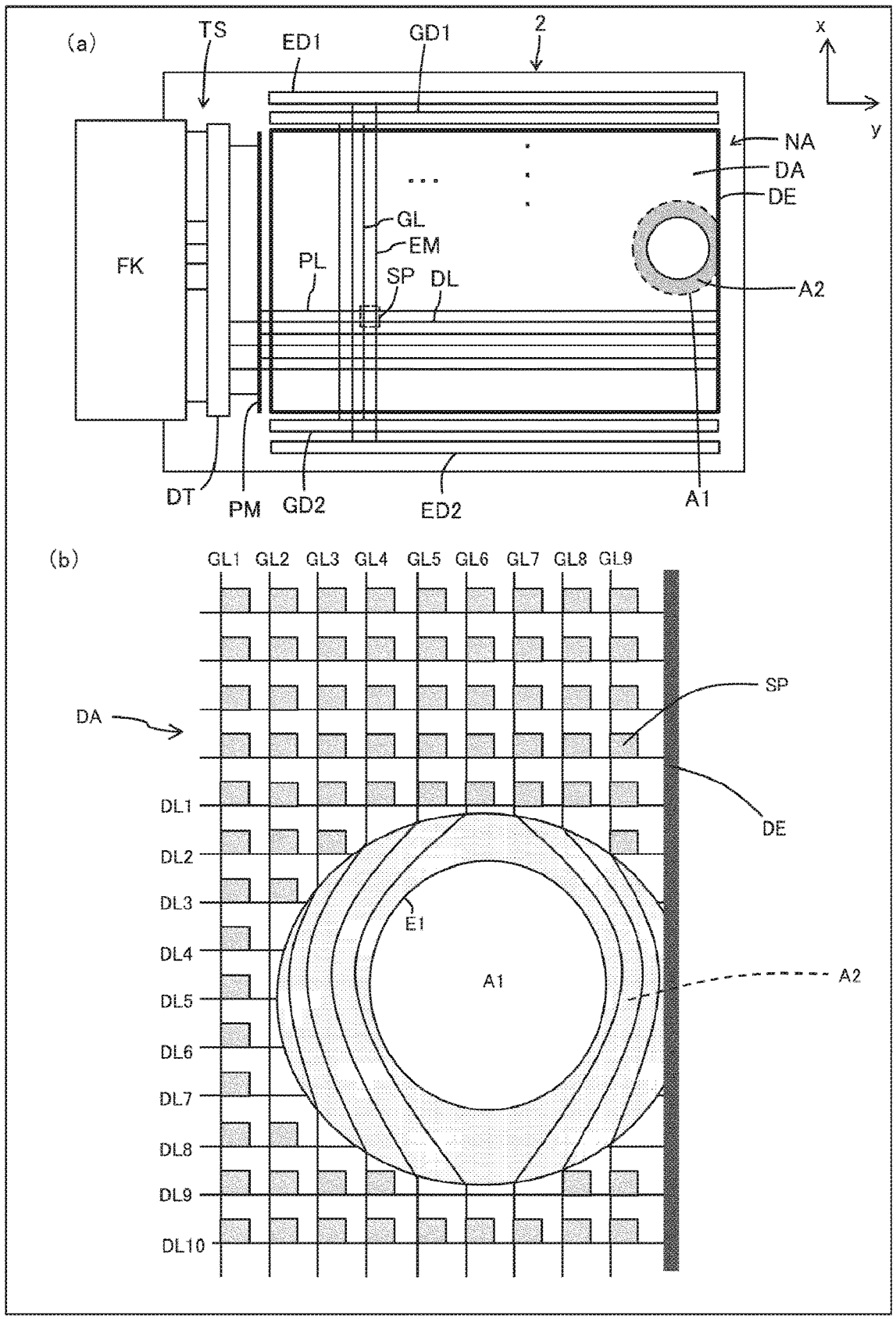
FIG. 9 is a plan view illustrating still another configuration around the aperture in the first embodiment.

Note that, as illustrated in FIG. 9, the region A2 may have three sides surrounded by the display area DA, and have the remaining one side in contact with the edge DE.

Second Embodiment

Figure 10:
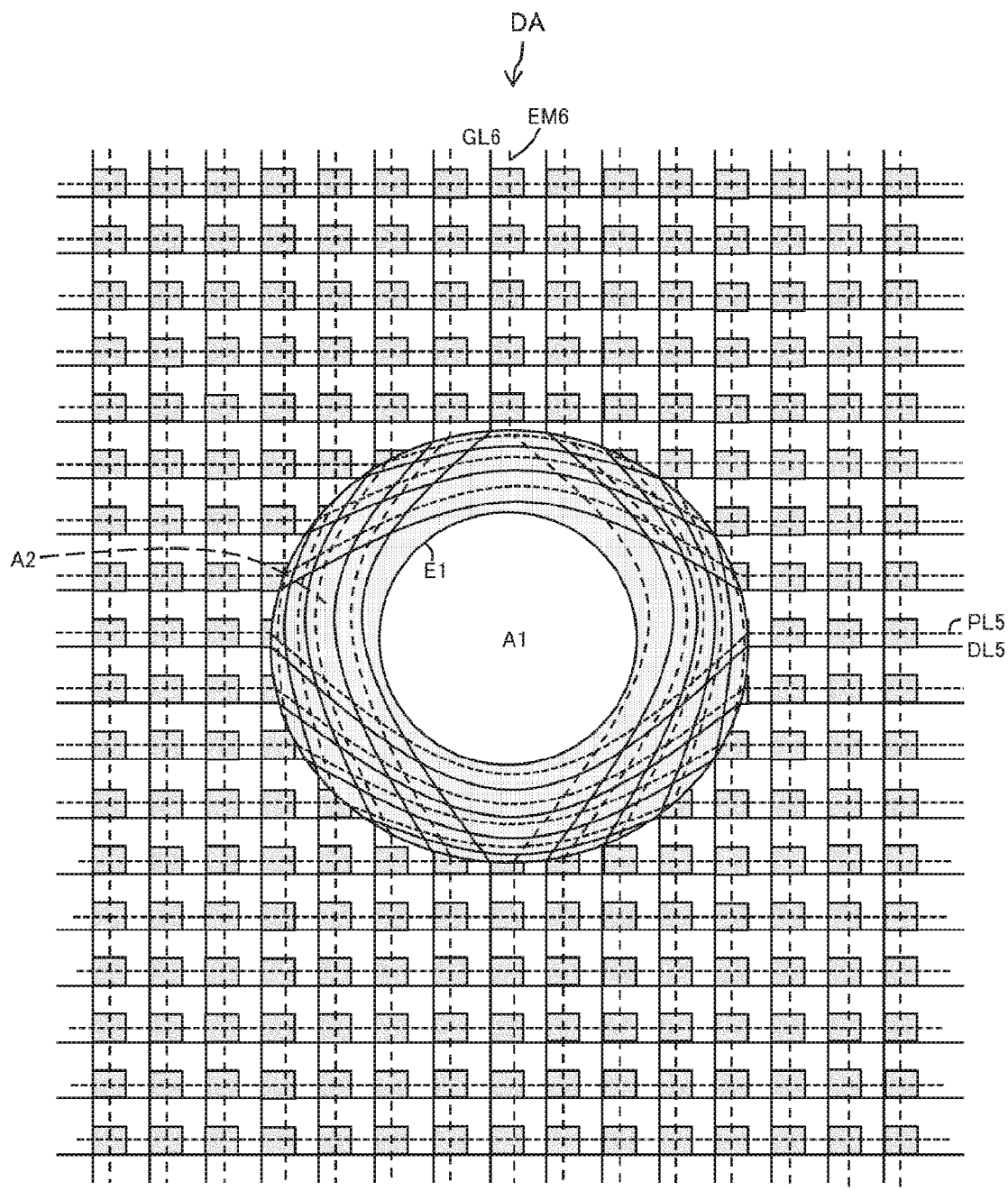
FIG. 10 is a plan view illustrating a configuration around an aperture in a second embodiment.
Figure 10:
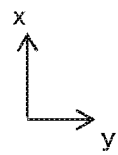

FIG. 10 is a plan view illustrating a configuration around the first region in a second embodiment. In the first embodiment, data signal lines and scanning signal lines running in the region A2 are routed to avoid the region A1. Alternatively, as illustrated in FIG. 10, for example, a light-emission control line EM6 and a high-voltage power supply line PL5 running in the region A2 can also be routed to avoid the region A1.

Summary

The electro-optical element (c.f., an electro-optical element whose brightness and transmittance are controlled by current) included in the display device according to the above embodiments is not limited to a particular one. Examples of the display device according to the above embodiments include: an organic electro-luminescence (EL) display including an OLED as an electro-optical element; an inorganic EL display including an inorganic light-emitting diode as an electro-optical element; and a quantum dot light-emitting-diode (QLED) display including a QLED as an electro-optical element.

First Aspect

A display device includes a display area including: a plurality of scanning signal lines; a plurality of data signal lines intersecting with the scanning signal lines; and a plurality of sub-pixel circuits each disposed on a corresponding one of a plurality of intersections of the scanning signal lines and the data signal lines, each of the sub-pixel circuits including: a control circuit including a transistor; a reflective electrode; a light-emitting element; and a transparent electrode, a first region and a second region being provided not to include the sub-pixel circuits, the first region being surrounded by the second region, and the second region being surrounded by the display area, when viewed orthogonally to the display area, a plurality of signal lines being provided across the second region, the signal lines including at least either two or more of the scanning signal lines, or two or more of the data signal lines, and the signal lines across the second region running out of an edge of the first region.

Second Aspect

In the display device according to, for example, the first aspect, neighboring two of the signal lines across the second region may be spaced apart from each other more widely in the second region than in the display area out of the second region.

Third Aspect

In the display device according to, for example, the first or second aspect, the first region may be larger than a region in which one sub-pixel circuit, included in the sub-pixel circuits, is formed.

Fourth Aspect

In the display device according to, for example, any one of the first to third aspects, the display area may include an inorganic insulating film and a planarization film included in a TFT layer below the light-emitting element, and
the inorganic insulating film and the planarization film may be formed in the first region and the second region.

Fifth Aspect

The display device according to, for example, the fourth aspect may further include a sealing layer formed to cover the display area, the first region, and the second region.

Sixth Aspect

In the display device according to, for example, any one of the first to fifth aspect, the signal lines may be routed to avoid the first region.

Seventh Aspect

In the display device according to, for example, any one of the first to sixth aspects, the first region does not have to include either the scanning signal lines or the data signal lines.

Eighth Aspect

The display device according to, for example, any one of the first to seventh aspects may further include a light transmission path for imaging provided to coincide with the first region.

Ninth Aspect

The display device according to, for example, any one of the first to eight aspects may further include an imaging element across from a display surface.

Tenth Aspect

In the display device according to, for example, any one of the first to ninth aspects, of the first region and the second region, at least the first region does not have to include a light-reflective electrode in the same layer in which a plurality of first electrodes included in the sub-pixel circuits are formed.

Eleventh Aspect

In the display device according to, for example, any one of the first to tenth aspects, of the first region and the second region, at least the first region does not have to include a light-emitting layer in the same layer in which a plurality of light-emitting layers included in the sub-pixel circuits are formed.

Twelfth Aspect

In the display device according to, for example, any one of the first to tenth aspects, the first region and the second region may include a dummy light-emitting layer formed in the same layer in which the light-emitting layers included in the sub-pixel circuits are formed, the dummy light-emitting layer not emitting light.

Thirteenth Aspect

In the display device according to, for example, the twelfth aspect, each of the light-emitting layers corresponding to one of the sub-pixel circuits may coincide with an opening of an edge cover covering an edge of each of the first electrodes, and the dummy light-emitting layer does not have to coincide with the opening of the edge cover.

Fourteenth Aspect

In the display device according to, for example, any one of the first to thirteenth aspects, neither the first region nor the second region may include the transistor.

Fifteenth Aspect

In the display device according to, for example, the twelfth aspect, the dummy light-emitting layer may be the same in shape and size as the light-emitting layers included in the sub-pixel circuits.

Sixteenth Aspect

In the display device according to, for example, any one of the first to fifteenth aspects, the signal lines may be collected together in a portion of the second region.

Seventeenth Aspect

The display device according to, for example, any one of the first to sixteenth aspects may further include a base material provided below the display area, and having no through hole.

Eighteenth Aspect

In the display device according to, for example, the first to seventeenth aspects, a third area may be provided not to include the sub-pixel circuits, the third area being surrounded by the second region, and the signal lines across the second region may run out of the edge of the first region and an edge of the third region.

REFERENCE SIGNS LIST

2 Display Device
3 Barrier Layer
4 TFT layer
5 Light-Emitting Element Layer
6 Sealing Layer
12 Resin Layer
16, 18, 20 Inorganic Insulating Film
21 Planarization Film
23 Edge Cover
24 EL Layer
DA Display Area
NA Frame Area
A1 First Region
A2 Second Region
GL Scanning Signal Line
DL Data Signal Line

The invention claimed is:

1. A display device, comprising:

a display area including: a plurality of scanning signal lines; a plurality of data signal lines intersecting with the scanning signal lines; and a plurality of sub-pixel circuits each disposed on a corresponding one of a plurality of intersections of the scanning signal lines and the data signal lines, each of the sub-pixel circuits including: a control circuit including a transistor; a reflective electrode; a light-emitting element; and a transparent electrode, a first region and a second region being provided not to include the sub-pixel circuits, the first region being surrounded by the second region, and the second region being surrounded by the display area, when viewed orthogonally to the display area, a plurality of signal lines is provided across the second region, the signal lines including at least two or more of the scanning signal lines, or two or more of the data signal lines, and the signal lines across the second region running out of an edge of the first region, wherein of the first region and the second region, at least the first region does not include a light-reflective electrode in a same layer in which a plurality of first electrodes included in the sub-pixel circuits are formed.

2. The display device according to claim 1, wherein neighboring two of the signal lines across the second region are spaced apart from each other more widely in the second region than in the display area outside of the second region.

3. The display device according to claim 1, wherein the first region is larger than a region in which one of the plurality of sub-pixel circuits is formed.

4. The display device according to claim 1, wherein the display area further includes an inorganic insulating film and a planarization film included in a TFT layer below the light-emitting element, and the inorganic insulating film and the planarization film are formed in the first region and the second region.

5. The display device according to claim 4, further comprising a sealing layer formed to cover the display area, the first region, and the second region.

6. The display device according to claim 1, wherein the signal lines are routed to avoid the first region.

7. The display device according to claim 1, wherein the first region does not include either the scanning signal lines or the data signal lines.

8. The display device according to claim 1, further comprising a light transmission path for imaging provided to coincide with the first region.

9. The display device according to claim 1, further comprising an imaging element across from a display surface.

10. A display device, comprising:

a display area including: a plurality of scanning signal lines; a plurality of data signal lines intersecting with the scanning signal lines; and a plurality of sub-pixel circuits each disposed on a corresponding one of a plurality of intersections of the scanning signal lines and the data signal lines, each of the sub-pixel circuits including: a control circuit including a transistor; a reflective electrode; a light-emitting element and a transparent electrode, a first region and a second region being provided not to include the sub-pixel circuits, the first region being surrounded by the second region, and the second region being surrounded by the display area, when viewed orthogonally to the display area, a plurality of signal lines is provided across the second region, the signal lines including at least two or more of the scanning signal lines, or two or more of the data signal lines, and the signal lines across the second region running out of an edge of the first region, wherein of the first region and the second region, at least the first region does not include a light-emitting layer in a same layer in which a plurality of light-emitting layers included in the sub-pixel circuits are formed.

11. A display device, comprising:

a display area including: a plurality of scanning signal lines; a plurality of data signal lines intersecting with the scanning signal lines; and a plurality of sub-pixel circuits each disposed on a corresponding one of a plurality of intersections of the scanning signal lines and the data signal lines, each of the sub-pixel circuits including: a control circuit including a transistor; a reflective electrode; a light-emitting element and a transparent electrode, a first region and a second region being provided not to include the sub-pixel circuits, the first region being surrounded by the second region, and the second region being surrounded by the display area, when viewed orthogonally to the display area, a plurality of signal lines is provided across the second region, the signal lines including at least two or more of the scanning signal lines, or two or more of the data signal lines, and the signal lines across the second region running out of an edge of the first region, wherein the first region and the second region include a dummy light-emitting layer formed in a same layer in which a plurality of light-emitting layers included in the sub-pixel circuits are formed, the dummy light-emitting layer not emitting light.

12. The display device according to claim 11, wherein each of the light-emitting layers corresponding to one of the sub-pixel circuits coincides with an opening of an edge cover covering an edge of each of a plurality of first electrodes, and the dummy light-emitting layer does not coincide with the opening of the edge cover.

13. The display device according to claim 11, wherein the dummy light-emitting layer is the same in shape and size as the light-emitting layers included in the sub-pixel circuits.

14. The display device according to claim 1, wherein a third area is provided not to include the sub-pixel circuits, the third area being surrounded by the second region, and the signal lines across the second region run out of the edge of the first region and an edge of the third region.

15. The display device according to claim 10, further comprising:

a third area provided not to include the sub-pixel circuits, the third area being surrounded by the second region, wherein the signal lines across the second region run out of the edge of the first region and an edge of the third region.

16. The display device according to claim 11, further comprising:

a third area provided not to include the sub-pixel circuits, the third area being surrounded by the second region, wherein the signal lines across the second region run out of the edge of the first region and an edge of the third region.

* * * * *